United States Patent
Wang et al.

(10) Patent No.: US 12,373,933 B2
(45) Date of Patent: Jul. 29, 2025

(54) CUTTING PATH PLANNING ALGORITHM FOR SEMICONDUCTOR WORKPIECE BASED ON IMAGE PROCESSING

(71) Applicant: Taiyuan University of Science and Technology, Taiyuan (CN)

(72) Inventors: Anhong Wang, Taiyuan (CN); Hao Jing, Taiyuan (CN); Zishan Tang, Taiyuan (CN); Peihao Li, Taiyuan (CN); Jiapeng Jia, Taiyuan (CN)

(73) Assignee: Taiyuan University of Science and Technology, Taiyuan (CN)

( * ) Notice: Subject to any disclaimer, the term of this patent is extended or adjusted under 35 U.S.C. 154(b) by 0 days.

(21) Appl. No.: 18/736,759

(22) Filed: Jun. 7, 2024

(65) Prior Publication Data
US 2024/0428393 A1    Dec. 26, 2024

(30) Foreign Application Priority Data
Jun. 25, 2023    (CN) .......................... 202310751582.6

(51) Int. Cl.
*G06T 7/00*    (2017.01)
*G06F 30/392*    (2020.01)
(Continued)

(52) U.S. Cl.
CPC .......... *G06T 7/0004* (2013.01); *G06F 30/392* (2020.01); *G06T 7/11* (2017.01);
(Continued)

(58) Field of Classification Search
CPC . G06T 7/0004; G06T 7/11; G06T 7/12; G06T 7/136; G06T 2207/20081; G06T 2207/30148; G06T 2207/30164; G06T 7/62; G06F 30/392; H01L 21/78; G06Q 10/047; G06Q 50/04
See application file for complete search history.

(56) References Cited

U.S. PATENT DOCUMENTS 12,175,721 B1 *  12/2024  Li .......................... G06T 7/0004
2008/0069452 A1    3/2008  Matsumoto
(Continued)

FOREIGN PATENT DOCUMENTS

CN        101523155 A    9/2009
CN        106846404 A    6/2017

OTHER PUBLICATIONS

Zhao Dongbao, et al., "Shape Contour Description and Matching Method Based on Complex Moments," Journal of Sichuan University (Engineering Science Edition), Mar. 2011, pp. 109-115, vol. 43, No. 02. DOI: 10.15961/j.jsuese.2011.02.028 Full text Claims involved: 1.

(Continued)

*Primary Examiner* — Bobbak Safaipour
(74) *Attorney, Agent, or Firm* — Piloff Passino & Cosenza LLP; Rachel K. Piloff; Sean A. Passino

(57) ABSTRACT

A cutting path planning algorithm for semiconductor workpiece based on image processing is provided, including the following steps: 1, obtaining a semantic boundary of an image; 2, finding a largest inscribed rectangle MRect in the single crystal image $X_1$; 3. dividing the contour region in the single crystal region to find the corresponding cutting line; and 4. determining the final cutting line.

1 Claim, 7 Drawing Sheets

(51) Int. Cl.
  *G06T 7/11*    (2017.01)
  *G06T 7/12*    (2017.01)
  *G06T 7/136*   (2017.01)

(52) U.S. Cl.
  CPC ............... *G06T 7/12* (2017.01); *G06T 7/136* (2017.01); *G06T 2207/20081* (2013.01); *G06T 2207/30148* (2013.01); *G06T 2207/30164* (2013.01)

(56) References Cited

U.S. PATENT DOCUMENTS

2011/0142323 A1*  6/2011  Chen .................. G06T 7/0012
                                                                382/132
2020/0104621 A1*  4/2020  Zhou .................. G06V 10/225

OTHER PUBLICATIONS

Anthony Bilodeau, et al., "MICRA-Net: MICRoscopy Analysis Neural Network to solve detection, classification, and segmentation from a single simple auxiliary task," Nature Machine Intelligence, Jun. 2021, pp. 1-23. DOI: 10.1101/2021.06.29.448970 Full text Claims involved: 1.
Retrieval report dated Nov. 8, 2024 in SIPO application No. 202310751582.6.
Notification to Grant Patent Right for Invention dated Nov. 15, 2024 in SIPO application No. 202310751582.6.

* cited by examiner

CUTTING PATH PLANNING ALGORITHM FOR SEMICONDUCTOR WORKPIECE BASED ON IMAGE PROCESSING

CROSS-REFERENCE TO RELATED APPLICATIONS

This application claims priority to Chinese Patent Application No. 202310751582.6, filed on Jun. 25, 2023, the contents of which are hereby incorporated by reference.

TECHNICAL FIELD

The present disclosure belongs to the technical field of image calculation, and in particular relates to a cutting path planning algorithm for semiconductor workpiece based on image processing.

BACKGROUND

A clean single crystal wafer is required for the growth of epitaxial layers of semiconductor materials. However, when the semiconductor material is cut from a crystal rod into wafers, there will be many different crystalline phases on each wafer, and it is necessary to remove the heterocrystal regions on the wafer and retain the required single crystal part.

In the prior art, the process flow of semiconductor wafer cutting is as follows: after the semiconductor material is cut into wafers from crystal rods, the boundaries between single crystals and heterocrystals are identified manually, and then the clean single crystal wafers are obtained by manual cutting with a knife. Most semiconductor materials contain precious and heavy metals with high value, and the existing manual processing methods will waste a lot of human resources; moreover, when cutting the wafer, manual instability often causes cutting errors or damage to the wafers, resulting in material waste; in addition, heavy metal materials are easily inhaled during manual operation, which will cause harm to operators.

SUMMARY

The main objective of the present disclosure is to overcome the shortcomings in the prior art and solve the technical problem of manually cutting off the heterocrystal region on the wafer. The present disclosure provides a cutting path planning algorithm for semiconductor workpiece based on image processing.

The design concept of the present disclosure is as follows: when cutting a wide-bandgap semiconductor material, it is necessary to keep the required single crystal part on a wafer with various crystal phases, so it is necessary to plan the cutting path to ensure that the usable part on the wafer is capable of being used to the maximum extent. According to the position of the single crystal on the wafer, the present disclosure uses an image processing algorithm to plan the cutting path to achieve the objective of automatic cutting. The algorithm proposed by the present disclosure firstly finds the largest inscribed rectangle in the single crystal contour, and then plans the path according to the intersection of the inscribed rectangle and the single crystal contour. Specifically, the algorithm includes the following steps: obtaining and preprocessing the workpiece image→extracting the single crystal contour→finding the largest inscribed rectangle→planning the cutting path.

The present disclosure is realized by the following technical scheme: a cutting path planning algorithm for semiconductor workpiece based on image processing, including the following steps:

S1, obtaining a semantic boundary of an image:

S1-1, obtaining a semantic image X through a deep learning model, and distinguishing different crystal phase regions in a wafer according to the semantic image X, where crystal phase regions to be reserved are single crystal regions, and rest parts are heterocrystal regions; setting the semantic image X as a gray scale map, where gray scale values of the single crystal regions are different from gray scale values of the heterocrystal regions; and S1-2, adjusting a color of the heterocrystal regions in the semantic image X obtained in S1-1 to be same as a background color to obtain a single crystal image $X_1$;

S2, finding a largest inscribed rectangle MRect in the single crystal image $X_1$:

S2-1, finding all contours in the single crystal image $X_1$, taking a contour with a largest area as a machining contour of a required product, and recording as contour "contour", and then storing all contour points on the contour "contour" in sequence, and making a position difference between two adjacent contour points not greater than 1;

S2-2, randomly selecting a contour point on the contour "contour" and marking the contour point as start(x,y), circulating points in the contour "contour" with the start(x,y) as a starting point, marking a current point on the contour "contour" as cur(x,y), and taking the starting point start(x, y) and the current point cur(x,y) as diagonal points of the rectangle to construct a rectangular contour;

S2-3, judging whether the rectangular contour constructed in S2-2 are all located inside the contour "contour", and if the rectangular contour constructed in S2-2 are all located inside the contour "contour", recording an area of the rectangular contour and corresponding diagonal point coordinates in this state;

S2-4, repeatedly executing steps S2-2 to S2-3, traversing all points on the contour "contour" to obtain an inscribed rectangular contour maxRect with a largest area in the contour "contour", and recording coordinates and an area of the inscribed rectangular contour maxRect with the largest area;

S2-5, calculating a space moment $m_{ji}$ of the contour "contour" according a formula (1):

$$m_{ji} = \sum\nolimits_{x,y} \left( (x, y) * x^j * y^i \right); \tag{1}$$

in the formula (1), x and y are coordinate values of the contour "contour", and i and j are image orders;

S2-6, when the image order i=0 or 1, and j=0 or 1, calculating a centroid center(x, y) of the contour "contour" from $m_{00}$, $m_{10}$ and $m_{01}$ obtained by a formula (2):

$$\begin{cases} x = \dfrac{m_{10}}{m_{00}} \\ y = \dfrac{m_{01}}{m_{00}}; \end{cases} \tag{2}$$

S2-7, rotating the single crystal image $X_1$ with the centroid center(x, y) of the contour "contour" determined in the S2-6 as a center, and obtaining a single crystal image $X_i$ every 5° of a rotation, wherein i is an integer greater than 1, and rotating by 360° in total, and repeating operations in the S2-2 to the S2-6 in each single crystal image $X_i$ to obtain all contours "contour" of each single crystal image $X_i$; and S2-8, comparing the inscribed rectangular contour maxRect with the largest area among all the contours "contour" in each single crystal image $X_i$, and determining an inscribed rectangle with a largest area in the single crystal regions as MRect;

S3, dividing contour regions in the single crystal regions to find corresponding cutting lines:

S3-1, respectively extending one side of four sides of the inscribed rectangle MRect to an outside, and dividing the single crystal regions outside the inscribed rectangle MRect into four regions of $Con_1$, $Con_2$, $Con_3$ and $Con_4$ by two extension lines at each vertex position of the inscribed rectangle MRect; and S3-2, selecting an intersection point of a vertex or the extension line of the inscribed rectangle MRect in $Con_1$ region and a contour of the single crystal region as $P_1(x,y)$, forming a straight line with any point $P_2(x,y)$ in the Con region, circulating all points in the Con region, calculating an area of a straight line formed by $P_2(x,y)$ and $P_1(x,y)$ cutting off heterocrystal regions, and sorting according to sizes of cutting off areas of the heterocrystal regions; selecting a group with a largest cutting off area of the heterocrystal regions as a candidate cutting line $L_1$; if areas of the heterocrystal regions cut off are the same, selecting a group with a largest area of a reserved single crystal region as the candidate cutting line $L_1$;

in $Con_1$, selecting an intersection point of another vertex or extension line of the inscribed rectangle MRect and a contour of the single crystal region as $P_3(x,y)$, forming a straight line with any point $P_2(x,y)$ in the Con region, and circulating all points in the Con region, and calculating an area of a straight line formed by $P_2(x,y)$ and $P_3(x,y)$ cutting off heterocrystal regions, and determining a candidate cutting line $L_2$ in a same way as in the S3-2;

similarly, obtaining corresponding candidate cutting lines $L_3$, $L_4$, $L_5$ and $L_6$ in $Con_2$ region, $Con_3$ region and $Con_4$ region respectively; and S4, determining a final cutting line:

traversing six candidate cutting lines $L_1$, $L_2$, $L_3$, $L_4$, $L_5$ and $L_6$ determined in the S3, and selecting a path being capable of forming a convex polygon single crystal region with a largest area, a largest area of the heterocrystal region cut off and a least number of straight line cutting off as a final cutting line path; a path optimization method is as follows:

setting an area of a divided single crystal pixel region to be $S_x$, where $A(\cdot)$ represents an area of the single crystal region cut off and $Z(\cdot)$ represents an area of the heterocrystal region cut off:

$$r_{opt1} = \left( \underset{r_e, e \in \Phi}{\operatorname{argmax}} \left( S_x - A \left( \underset{r_e, e \in \Phi}{\operatorname{argmax}} (Z(r_e \cup_{k=1}^p l_k)) \right) \right) \right) \bigg|_{min\ p} ; \quad (3)$$

$$\Phi = [1, \sum_{p=1}^m C_m^p], \text{shape}_e \text{ is convex;} \quad (4)$$

where p represents a number of currently selected cutting lines; $l_k$ represents a selected k-th cutting line; m represents a total number of all candidate cutting lines, meaning a maximum number; $C_m^p$ represents a number of permutation and combinations of selected p cutting lines among all m cutting lines; $r_e$ represents a planned path under a current e-th permutation and combination; $shape_e$ represents a shape of a wafer cut by an e-th path; $\Phi$ represents a value range of e; $r_{opt1}$ represents a currently selected optimal path, including selected p cutting lines.

Compared with the prior art, the present disclosure has the following beneficial effects.

The present disclosure provides a cutting path planning algorithm for semiconductor workpiece based on image processing, which realizes the automation of marking path planning, and the planned path may realize the marking of wafers, and meets the actual processing requirements while the number of cutting knives is small. The single crystal obtained as a result of cutting does not include heterocrystals, and the integrity of heterocrystals may be ensured while the single crystal part is reserved to the maximum extent, so that the waste of materials is reduced, and the processing efficiency of wafer scribing is improved. Compared with the existing manual cutting-up, the present disclosure may avoid the damage to the wafer caused by manual dicing and the harm to the human body caused by long-term contact with the wafer during processing.

DETAILED DESCRIPTION OF THE EMBODIMENTS

In the following, the present disclosure will be further described in detail with the attached drawings and embodiments.

Figure 1:
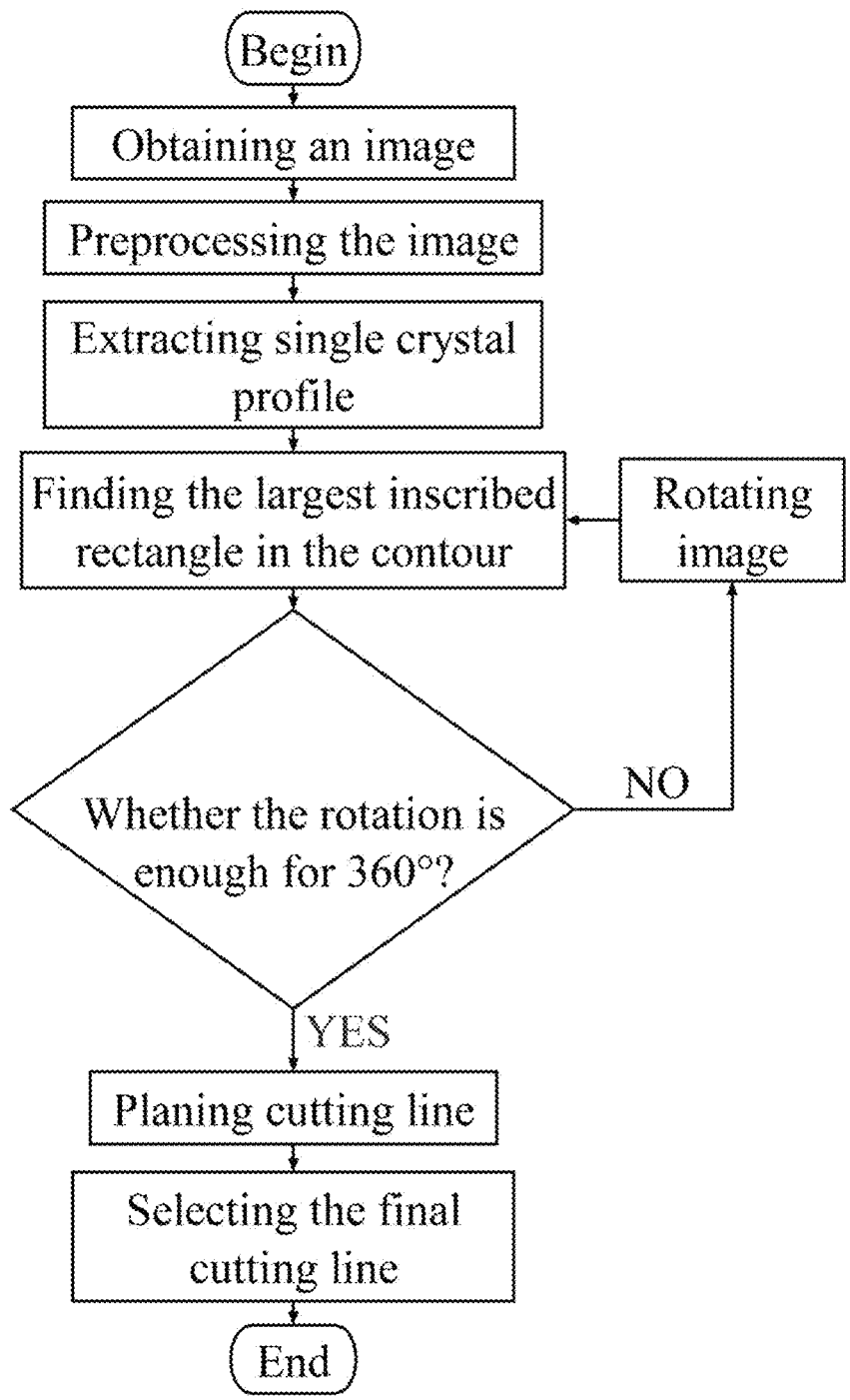
FIG. 1 is a flow chart of the present application.
Figure 2:
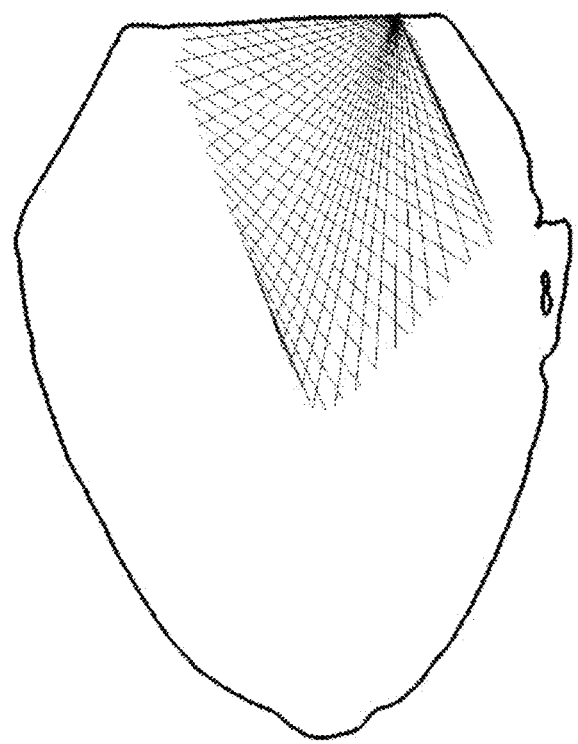
FIG. 2 is a crystal diagram of a semantic image X obtained by a deep learning model in a specific embodiment.
Figure 3:
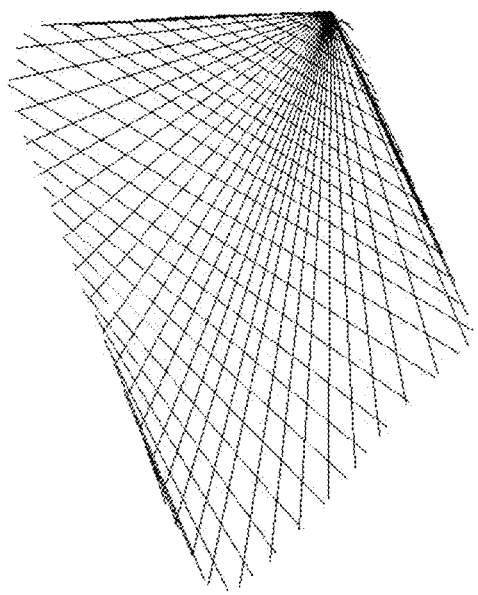
FIG. 3 is a crystal diagram of the single crystal region obtained after the preprocessing of FIG. 2 (the color of the heterocrystal region is adjusted to be same as the background color).

As shown in FIG. 1, a cutting path planning algorithm for semiconductor workpiece based on image processing includes the following steps:

S1, obtaining a semantic boundary of an image:

S1-1, obtaining a semantic image X through a deep learning model, and distinguishing different crystal phase regions in a wafer according to the semantic image X, wherein crystal phase regions to be reserved are single crystal regions, and rest parts are heterocrystal regions; setting the semantic image X as a gray scale map, where gray scale values of the single crystal regions are different from gray scale values of the heterocrystal regions; in this embodiment, the grayscale value of the single crystal region is 50, and the grayscale value of the heterocrystal region is 100; and S1-2, adjusting a color of the heterocrystal regions in the semantic image X obtained in S1-1 to be same as a background color to obtain a single crystal image $X_1$ (as shown in FIG. 3);

S2, finding a largest inscribed rectangle MRect in the single crystal image $X_1$;

S2-1, finding all contours in the single crystal image $X_1$, taking a contour with a largest area as a machining contour of a required product, and recording as contour "contour", and then storing all contour points on the contour "contour" in sequence, and making a position difference between two adjacent contour points not greater than 1;

S2-2, randomly selecting a contour point on the contour "contour" and marking the contour point as start(x,y), circulating points in the contour "contour" with the start(x,y) as a starting point, marking a current point on the contour "contour" as cur(x,y), and taking the starting point start(x, y) and the current point cur(x,y) as diagonal points of the rectangle to construct a rectangular contour;

S2-3, judging whether the rectangular contour constructed in S2-2 are all located inside the contour "contour", and if the rectangular contour constructed in S2-2 are all located inside the contour "contour", recording an area of the rectangular contour and corresponding diagonal point coordinates in this state;

S2-4, repeatedly executing steps S2-2 to S2-3, traversing all points on the contour "contour" to obtain an inscribed rectangular contour maxRect with a largest area in the contour "contour", and recording coordinates and an area of the inscribed rectangular contour maxRect with the largest area;

S2-5, calculating a space moment mji of the contour "contour" according a formula (1):

$$m_{ji} = \sum_{x,y} ((x, y) * x^j * y^i); \quad (1)$$

in the formula (1), x and y are coordinate values of the contour "contour", and i and j are image orders;

S2-6, when the image order i=0 or 1, and j=0 or 1, calculating a centroid center(x, y) of the contour "contour" from m00, m10 and m01 obtained by a formula (2):

$$\begin{cases} x = \dfrac{m_{10}}{m_{00}} \\ y = \dfrac{m_{01}}{m_{00}}; \end{cases} \quad (2)$$

Figure 4:
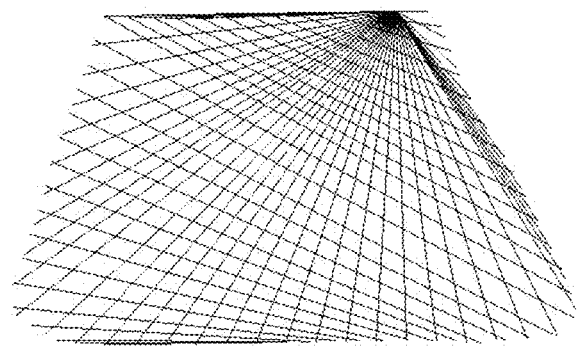
FIG. 4 is a crystal diagram of a single crystal region obtained after the rotation of FIG. 3.
Figure 5:
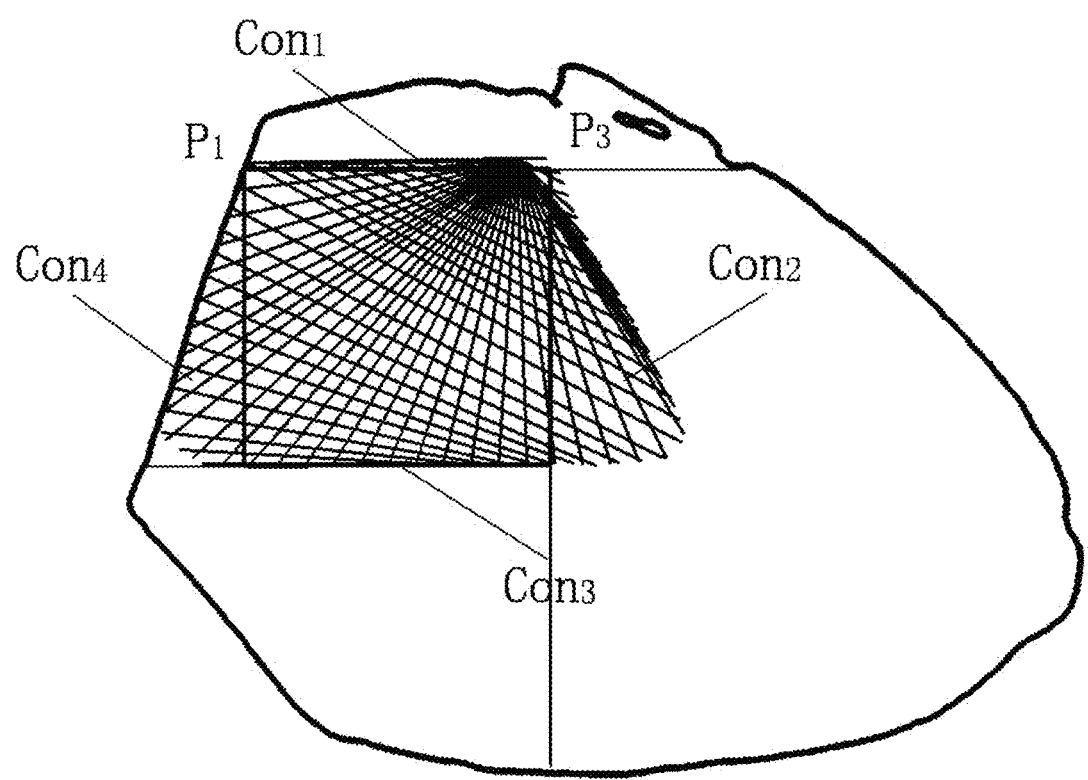
FIG. 5 is a schematic diagram of a contour region in a single crystal region.
Figure 6:
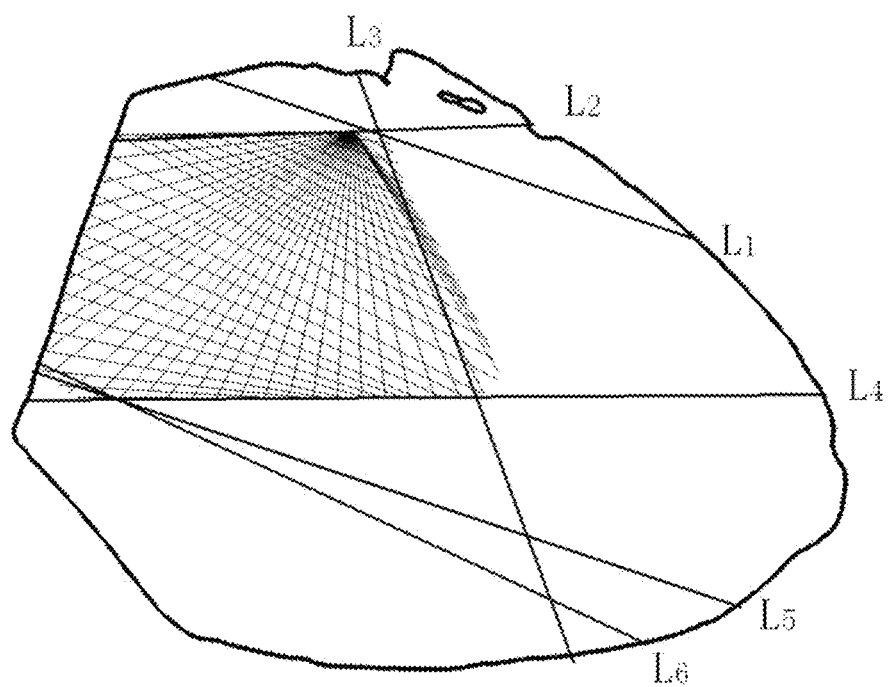
FIG. 6 is a schematic diagram of a candidate cutting line.
Figure 7:
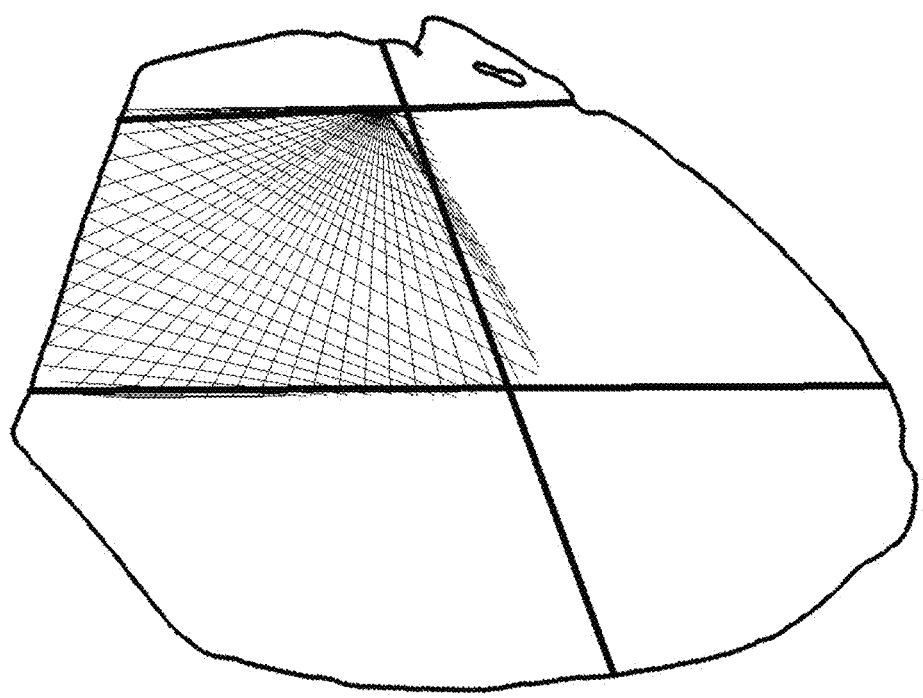
FIG. 7 is a cutting path diagram in a specific embodiment.

S2-7, rotating the single crystal image $X_1$ with the centroid center(x, y) of the contour "contour" determined in the S2-6 as a center, and obtaining a single crystal image $X_i$ (as shown in FIG. 4) every 5° of a rotation, wherein i is an integer greater than 1, and rotating by 360° in total, and repeating operations in the S2-2 to the S2-6 in each single crystal image $X_i$ to obtain all contours "contour" of each single crystal image $X_i$; and S2-8, comparing the inscribed rectangular contour maxRect with the largest area among all the contours "contour" in each single crystal image $X_i$, and determining an inscribed rectangle with a largest area in the single crystal regions as MRect;

S3, dividing contour regions in the single crystal regions to find corresponding cutting lines:

S3-1, respectively extending one side of four sides of the inscribed rectangle MRect to an outside, and dividing the single crystal regions outside the inscribed rectangle MRect into four regions (as shown in FIG. 5) of $Con_1$, $Con_2$, $Con_3$ and $Con_4$ by two extension lines at each vertex position of the inscribed rectangle MRect; and S3-2, selecting an intersection point of a vertex or the extension line of the inscribed rectangle MRect in $Con_1$ region and a contour of the single crystal region as $P_1(x,y)$, forming a straight line with any point $P_2(x,y)$ in the $Con_1$ region, circulating all points in the $Con_1$ region, calculating an area of a straight line formed by $P_2(x,y)$ and $P_1(x,y)$ cutting off heterocrystal regions, and sorting according to sizes of cutting off areas of the heterocrystal regions; selecting a group with a largest cutting off area of the heterocrystal regions as a candidate cutting line $L_1$; if areas of the heterocrystal regions cut off are the same, selecting a group with a largest area of a reserved single crystal region as the candidate cutting line $L_1$;

in $Con_1$, selecting an intersection point of another vertex or extension line of the inscribed rectangle MRect and a contour of the single crystal region as $P_3(x,y)$, forming a straight line with any point $P_2(x,y)$ in the Con region, and circulating all points in the Con region, and calculating an area of a straight line formed by $P_2(x,y)$ and $P_3(x,y)$ cutting off heterocrystal regions, and determining a candidate cutting line $L_2$ in a same way as in the S3-2; sorting according to sizes of cutting off areas of the heterocrystal regions; selecting a group with a largest cutting off area of the heterocrystal regions as a candidate cutting line $L_2$; if areas of the heterocrystal regions cut off are the same, selecting a group with a largest area of a reserved single crystal region as the candidate cutting line $L_2$;

similarly, obtaining corresponding candidate cutting lines $L_3$, $L_4$, $L_5$ and $L_6$ in $Con_2$ region, $Con_3$ region and $Con_4$ region respectively (as shown in FIG. 6); and S4, determining a final cutting line:

in order to ensure as few cutting lines as possible, path optimization is necessary. Traversing six candidate cutting lines $L_1$, $L_2$, $L_3$, $L_4$, $L_5$ and $L_6$ determined in the S3, and selecting a path being capable of forming a convex polygon single crystal region with a largest area, a largest area of the heterocrystal region cut off and a least number of straight line cutting off as a final cutting line path (as shown in FIG. 7). The path optimization method is as follows:

setting an area of a divided single crystal pixel region to be $S_x$, where A(·) represents an area of the single crystal region cut off and Z(·) represents an area of the heterocrystal region cut off:

$$r_{opt1} = \left. \left( \underset{r_e, e \in \Phi}{\mathrm{argmax}} \left( S_x - A \left( \underset{r_e, e \in \Phi}{\mathrm{argmax}} (Z(r_e \cup_{k=1}^p l_k)) \right) \right) \right) \right|_{\min\ p} ; \quad (3)$$

$$\Phi = \left[ 1, \sum_{p=1}^m C_m^p \right], shape_e\ \text{is convex}; \quad (4)$$

where p represents a number of currently selected cutting lines; $l_k$ represents a selected k-th cutting line; m represents a total number of all candidate cutting lines, meaning a maximum number; $C_m^p$ represents a number of permutation and combinations of selected p cutting lines among all m cutting lines; $r_e$ represents a planned path under a current e-th permutation and combination; $shape_e$ represents a shape of a wafer cut by an e-th path;

Φ represents a value range of e; $r_{opt1}$ represents a currently selected optimal path, including selected p cutting lines.

The result of cutting line planning in this embodiment is shown in FIG. 7. By finding the largest inscribed rectangle in the contour of the single crystal region, the single crystal is divided into regions, and then cutting lines are planned in each region, so that there will be no redundant cutting lines, and cutting lines which are sufficient and not redundant may be planned.

The above describes only the specific embodiment of the present application, but the protection scope of the present application is not limited to this, and any change or substitution that may be easily thought of by a person familiar with the technical field within the technical scope disclosed by the present application should be included in the protection scope of the present application. Therefore, the protection scope of the present application should be based on the protection scope of the claims.

What is claimed is:

1. A cutting path planning algorithm for semiconductor workpiece based on image processing, comprising following steps:

S1, obtaining a semantic boundary of an image:

S1-1, obtaining a semantic image X through a deep learning model, and distinguishing different crystal phase regions in a wafer according to the semantic image X, wherein crystal phase regions to be reserved are single crystal regions, and rest parts are heterocrystal regions; setting the semantic image X as a gray scale map, wherein gray scale values of the single crystal regions are different from gray scale values of the heterocrystal regions; and S1-2, adjusting a color of the heterocrystal regions in the semantic image X obtained in the S1-1 to be same as a background color to obtain a single crystal image $X_1$;

S2, finding a largest inscribed rectangle MRect in the single crystal image $X_1$:

S2-1, finding all contours in the single crystal image $X_1$, taking a contour with a largest area as a machining contour of a required product, and recording as contour "contour", and then storing all contour points on the contour "contour" in sequence, and making a position difference between two adjacent contour points not greater than 1;

S2-2, randomly selecting a contour point on the contour "contour" and marking as start(x,y), circulating points in the contour "contour" with the start(x,y) as a starting point, marking a current point on the contour "contour" as cur(x,y), and taking the starting point start(x, y) and the current point cur(x,y) as diagonal points of the rectangle to construct a rectangular contour;

S2-3, judging whether the rectangular contour constructed in the S2-2 are all located inside the contour "contour", and if so, recording an area of the rectangular contour and corresponding diagonal point coordinates in this state;

S2-4, repeatedly executing the S2-2 to the S2-3, traversing all points on the contour "contour" to obtain an inscribed rectangular contour maxRect with a largest area in the contour "contour", and recording coordinates and an area of the inscribed rectangular contour maxRect with the largest area;

S2-5, calculating a space moment $m_{ji}$ of the contour "contour" according a formula (1):

$$m_{ji} = \sum_{x,y} ((x, y) * x^j * y^i); \quad (1)$$

wherein in the formula (1), x and y are coordinate values of the contour "contour", and i and j are image orders;

S2-6, when the image order i=0 or 1, and j=0 or 1, calculating a centroid center(x, y) of the contour "contour" from $m_{00}$, $m_{10}$ and $m_{01}$ obtained by a formula (2):

$$\begin{cases} x = \frac{m_{10}}{m_{00}} \\ y = \frac{m_{01}}{m_{00}}; \end{cases} \quad (2)$$

S2-7, rotating the single crystal image $X_1$ with the centroid center(x, y) of the contour "contour" determined in the S2-6 as a center, and obtaining a single crystal image $X_i$ every 5° of a rotation, wherein i is an integer greater than 1, and rotating by 360° in total, and repeating operations in the S2-2 to the S2-6 in each single crystal image $X_i$ to obtain all contours "contour" of each single crystal image $X_i$; and S2-8, comparing the inscribed rectangular contour maxRect with the largest area among all the contours "contour" in each single crystal image $X_i$, and determining an inscribed rectangle with a largest area in the single crystal regions as MRect;

S3, dividing contour regions in the single crystal regions to find corresponding cutting lines:

S3-1, respectively extending one side of four sides of the inscribed rectangle MRect to an outside, and dividing the single crystal regions outside the inscribed rectangle MRect into four regions of $Con_1$, $Con_2$, $Con_3$ and $Con_4$ by two extension lines at each vertex position of the inscribed rectangle MRect; and S3-2, selecting an intersection point of a vertex or the extension line of the inscribed rectangle MRect in $Con_1$ region and a contour of the single crystal region as $P_1(x,y)$, forming a straight line with any point $P_2(x,y)$ in the $Con_1$ region, circulating all points in the Con region, calculating an area of a straight line formed by $P_2(x,y)$ and $P_1(x,y)$ cutting off heterocrystal regions, and sorting according to sizes of cutting off areas of the heterocrystal regions; selecting a group with a largest cutting off area of the heterocrystal regions as a candidate cutting line $L_1$; if areas of the heterocrystal regions cut off are same, selecting a group with a largest area of a reserved single crystal region as the candidate cutting line $L_1$;

in $Con_1$, selecting an intersection point of another vertex or extension line of the inscribed rectangle MRect and a contour of the single crystal region as $P_3(x,y)$, forming a straight line with any point $P_2(x,y)$ in the Con region, and circulating all the points in the $Con_1$ region, and calculating an area of a straight line formed by $P_2(x,y)$ and $P_3(x,y)$ cutting off heterocrystal regions, and determining a candidate cutting line $L_2$ in a same way as in the S3-2;

similarly, obtaining corresponding candidate cutting lines $L_3$, $L_4$, $L_5$ and $L_6$ in $Con_2$ region, $Con_3$ region and $Con_4$ region respectively; and S4, determining a final cutting line:

traversing the six candidate cutting lines $L_1$, $L_2$, $L_3$, $L_4$, $L_5$ and $L_6$ determined in the S3, and selecting a path being capable of forming a convex polygon single crystal region with a largest area, a largest area of the heterocrystal region cut off and a least number of straight line cutting off as a final cutting line path, wherein a path optimization method is:

setting an area of a divided single crystal pixel region to be $S_x$, wherein $A(\cdot)$ represents an area of the single crystal region cut off and $Z(\cdot)$ represents an area of the heterocrystal region cut off:

$$r_{opt1} = \left(\underset{r_e, e \in \Phi}{\operatorname{argmax}}\left(S_x - A\left(\underset{r_e, e \in \Phi}{\operatorname{argmax}}(Z(r_e \cup_{k=1}^{p} l_k))\right)\right)\right)\bigg|_{\min p} ; \quad (3)$$

$$\Phi = \left[1, \sum_{p=1}^{m} C_m^p\right], \text{shape}_e \text{ is convex}; \quad (4)$$

wherein p represents a number of currently selected cutting lines; $l_k$ represents a selected k-th cutting line; m represents a total number of all candidate cutting lines, meaning a maximum number; $C_m^p$ represents a number of permutation and combinations of selected p cutting lines among all m cutting lines; $r_e$ represents a planned path under a current e-th permutation and combination; $\text{shape}_e$ represents a shape of a wafer cut by an e-th path; $\Phi$ represents a value range of e; and $r_{opt1}$ represents a currently selected optimal path, consisting of selected p cutting lines.

* * * * *